United States Patent
Bai et al.

(10) Patent No.: US 10,026,785 B2
(45) Date of Patent: Jul. 17, 2018

(54) PIXEL AND CONTACT ARRANGEMENT FOR ORGANIC LIGHT EMITTING DIODE DISPLAY DEVICE, AND DISPLAY APPARATUS

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Shanshan Bai, Beijing (CN); Fengli Ji, Beijing (CN); Jiantao Liu, Beijing (CN); Jingbo Xu, Beijing (CN); Yinan Liang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 59 days.

(21) Appl. No.: 14/892,837

(22) PCT Filed: Mar. 3, 2015

(86) PCT No.: PCT/CN2015/073570
§ 371 (c)(1),
(2) Date: Nov. 20, 2015

(87) PCT Pub. No.: WO2016/082364
PCT Pub. Date: Jun. 2, 2016

(65) Prior Publication Data
US 2016/0358985 A1 Dec. 8, 2016

(30) Foreign Application Priority Data

Nov. 28, 2014 (CN) .......................... 2014 1 0714887

(51) Int. Cl.
*H01L 27/32* (2006.01)
*H01L 51/50* (2006.01)
(Continued)

(52) U.S. Cl.
CPC ....... *H01L 27/3218* (2013.01); *G09G 3/3208* (2013.01); *H01L 27/32* (2013.01);
(Continued)

(58) Field of Classification Search
CPC ............ H01L 27/3211; H01L 27/3213; H01L 27/326; H01L 27/3276; H01L 51/5203;
(Continued)

(56) References Cited

U.S. PATENT DOCUMENTS 6,281,634 B1 * 8/2001 Yokoyama .......... H01L 27/3211
313/506
6,297,589 B1 * 10/2001 Miyaguchi ............. H05B 33/12
313/504
(Continued)

FOREIGN PATENT DOCUMENTS

CN 103366683 * 10/2013 ............. G09G 3/007
CN 103366683 A 10/2013
(Continued)

OTHER PUBLICATIONS

Second Chinese Office Action dated Nov. 29, 2016, Appln. No. 201410714887.0.
(Continued)

*Primary Examiner* — Victoria K Hall
(74) *Attorney, Agent, or Firm* — Ladas & Parry LLP

(57) ABSTRACT

An organic light emitting diode display device and a display apparatus, and a mask for fabricating a sub-pixel of the organic light emitting diode display device are provided. Each pixel unit group includes a first sub-pixel unit group and a second sub-pixel unit group which are disposed
(Continued)

adjacently along a first direction and include three sub-pixels of different colors, respectively; and the three sub-pixels in the first sub-pixel unit group and the three sub-pixels in the second sub-pixel unit group are staggered along a second direction, and a color of any sub-pixel on a base substrate is different from a color of any other sub-pixel adjacent to the sub-pixel.

15 Claims, 16 Drawing Sheets

(51) Int. Cl.
  *H01L 51/56* (2006.01)
  *G09G 3/3208* (2016.01)

(52) U.S. Cl.
  CPC .......... *H01L 27/3276* (2013.01); *H01L 51/50* (2013.01); *H01L 51/56* (2013.01); *H01L 2227/323* (2013.01); *Y10T 428/24306* (2015.01)

(58) Field of Classification Search
  CPC ............. H01L 27/3216; H01L 27/3218; G02F 2201/52
  See application file for complete search history.

(56) References Cited

U.S. PATENT DOCUMENTS

| | | | | |
|---|---|---|---|---|
| 6,614,498 | B1* | 9/2003 | Tanaka | G02F 1/133514 349/106 |
| 9,614,191 | B2* | 4/2017 | Madigan | H01L 51/56 |
| 2001/0022496 | A1* | 9/2001 | Kobayashi | H01L 27/32 313/504 |
| 2002/0070909 | A1* | 6/2002 | Asano | G09G 3/3233 345/76 |
| 2003/0030766 | A1* | 2/2003 | Kiguchi | G02B 5/201 349/106 |
| 2003/0137242 | A1* | 7/2003 | Seki | H01L 27/3246 313/506 |
| 2003/0201445 | A1 | 10/2003 | Park et al. | |
| 2004/0155857 | A1* | 8/2004 | Duthaler | G02F 1/1334 345/107 |
| 2005/0001542 | A1* | 1/2005 | Kiguchi | H01L 27/3216 313/504 |
| 2005/0253881 | A1* | 11/2005 | Murayama | H01L 51/0022 347/9 |
| 2006/0061268 | A1* | 3/2006 | Nakanishi | H01L 27/3276 313/506 |
| 2007/0070093 | A1* | 3/2007 | Lin | G02F 1/134336 345/694 |
| 2009/0104403 | A1* | 4/2009 | Aoyama | B32B 7/02 428/136 |
| 2009/0104721 | A1* | 4/2009 | Hirakata | C23C 14/042 438/29 |
| 2009/0220706 | A1* | 9/2009 | Yamazaki | C23C 14/28 427/596 |
| 2009/0256169 | A1* | 10/2009 | Yokoyama | H01L 51/0096 257/98 |
| 2009/0280589 | A1* | 11/2009 | Ikeda | H01L 51/0013 438/29 |
| 2011/0285936 | A1* | 11/2011 | Horikawa | G02B 5/201 349/61 |
| 2013/0300956 | A1* | 11/2013 | Chen | G02B 27/2214 349/15 |
| 2014/0097745 | A1* | 4/2014 | Shiraga | H01L 27/322 313/504 |
| 2015/0015466 | A1* | 1/2015 | Feng | G09G 3/2003 345/77 |
| 2015/0192834 | A1* | 7/2015 | Morinaga | G02F 1/136213 349/39 |
| 2015/0380471 | A1* | 12/2015 | Guo | G09G 3/20 345/76 |
| 2016/0196776 | A1* | 7/2016 | Yang | G09G 3/2003 345/694 |
| 2016/0247433 | A1* | 8/2016 | Guo | G09G 3/20 |
| 2016/0253943 | A1* | 9/2016 | Wang | G09G 3/2003 345/694 |
| 2016/0253972 | A1* | 9/2016 | Bai | G09G 3/3208 345/690 |
| 2016/0284766 | A1* | 9/2016 | Wang | H01L 27/3218 |
| 2016/0357070 | A1* | 12/2016 | Yang | G02F 1/134309 |
| 2016/0370919 | A1* | 12/2016 | Xu | G06F 3/044 |
| 2017/0147121 | A1* | 5/2017 | Yang | G06F 3/0416 |

FOREIGN PATENT DOCUMENTS

| | | |
|---|---|---|
| CN | 104362170 A | 2/2015 |
| JP | 2007-017477 A | 1/2007 |

OTHER PUBLICATIONS

First Chinese Office Action dated Sep. 30, 2016, Appln. No. 201410714887.0.
International Search Report & Written Opinion Appln. No. PCT/CN2015/073570; dated Sep. 2, 2015.

* cited by examiner

PIXEL AND CONTACT ARRANGEMENT FOR ORGANIC LIGHT EMITTING DIODE DISPLAY DEVICE, AND DISPLAY APPARATUS

TECHNICAL FIELD

Embodiments of the present disclosure relate to an organic light emitting diode display device, a driving method thereof and a related apparatus.

BACKGROUND

An Organic Light Emitting Diode (OLED) display device is one of hot topics in a research field of flat-panel displays; as compared with a liquid crystal display, the OLED display device has advantages of low power consumption, low production cost, self-luminous, a wide viewing angle and a fast response speed; and currently, in the field of flat-panel display such as a mobile phone, a Personal Digital Assistant (PDA) and a digital camera, the OLED display device has begun to replace a traditional liquid crystal display.

A structure of the OLED display device mainly comprises: a base substrate and pixels arranged in a matrix on the base substrate, wherein, for each of the pixels, an organic light emitting diode structure is generally formed in a corresponding pixel position on an array substrate with an organic material by using an evaporation filming technology through a fine mask. For color display, it is necessary to colorize the OLED display device. Therein, a color picture using a side-by-side mode has the better effect. The side-by-side mode refers to that within one pixel range, there are three sub-pixels, i.e., red, green and blue (R, G and B) sub-pixels, and each sub-pixel has an independent organic light emitting diode structure. Since organic light emitting materials of the three sub-pixels, i.e., red, green and blue sub-pixels are different, in a fabrication procedure, it is necessary to respectively evaporate three different types of organic light emitting materials for the three primary colors, i.e., red, green and blue sub-pixels in the corresponding positions by a mask, and then a color mixing ratio of a combination of the three colors is adjusted, so as to produce a true color.

A technical focus for fabricating an OLED display device of high Pixel Per Inch (PPI) lies in a fine mask with a good mechanical stability, and a key of the fine mask lies in an arrangement mode of pixels and sub-pixels.

SUMMARY

A first aspect of the present disclosure provides an organic light emitting diode display device, comprising a base substrate and a plurality of pixel unit groups arranged in a matrix on the base substrate, and each of the pixel unit groups including a first sub-pixel unit group and a second sub-pixel unit group which are disposed adjacently along a first direction, and each of the first sub-pixel unit group and the second sub-pixel unit group comprising three sub-pixels of different colors, wherein, the first sub-pixel unit group includes a first sub-pixel, a second sub-pixel and a third sub-pixel sequentially arranged along a second direction, and the second sub-pixel unit group includes a third sub-pixel, a first sub-pixel and a second sub-pixel sequentially arranged along the second direction; the three sub-pixels in the first sub-pixel unit group and the three sub-pixels in the second sub-pixel unit group are staggered along the second direction, and a color of any sub-pixel on the base substrate is different from a color of any other sub-pixel adjacent to the sub-pixel; and each of the sub-pixels in the pixel unit group has a shape of polygon with the number of sides greater than or equal to four.

A second aspect of the present disclosure provides a display apparatus, comprising the above-described organic light emitting diode display device provided by the embodiment of the present disclosure.

A third aspect of the present disclosure provides a mask for fabricating a sub-pixel of an organic light emitting diode display device, comprising a substrate, and a plurality of opening regions of a same size arranged in a plurality of columns sequentially along a preset direction on the substrate, wherein, the opening regions have a shape of parallel hexagon, and adjacent sides of the adjacent opening regions are parallel; a center of any opening region in an odd-numbered column is located on a midnormal of a connection line between centers of two opening regions in an even-numbered column adjacent to the opening region in the odd-numbered column, and a center of any opening region in an even-numbered column is located on a midnormal of a connection line between centers of two opening regions in an odd-numbered column adjacent to the opening region in the even-numbered column; and a width between two adjacent opening regions in a same column is greater than or equal to 2 times a maximum opening width of the opening region along the preset direction.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1:
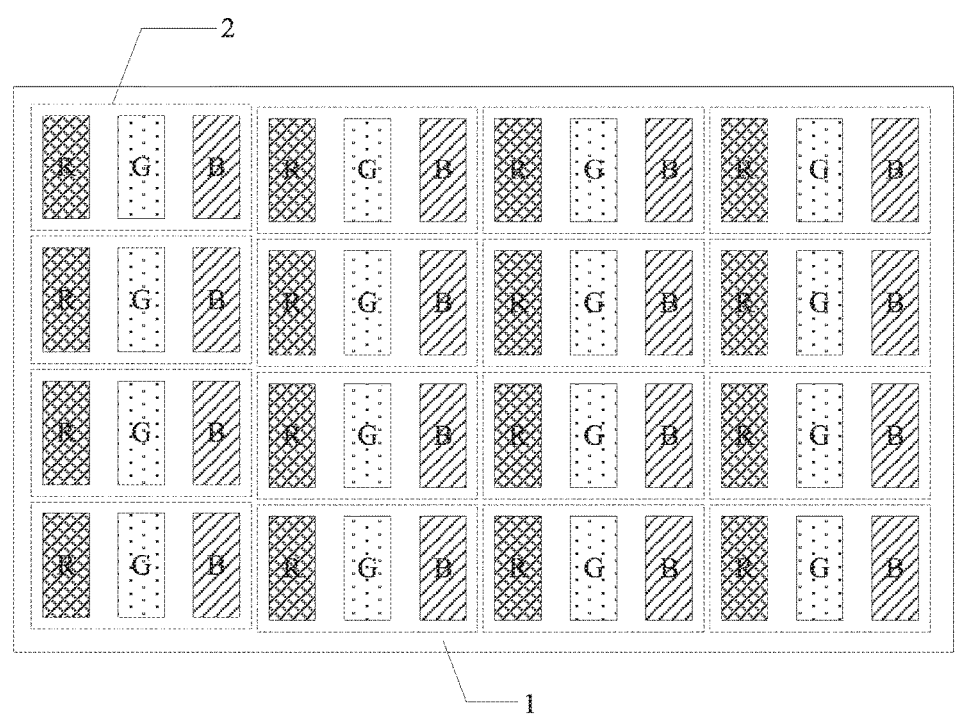
FIG. 1 is a structural schematic diagram of a pixel arrangement of an organic light emitting diode display device.
Figure 2:
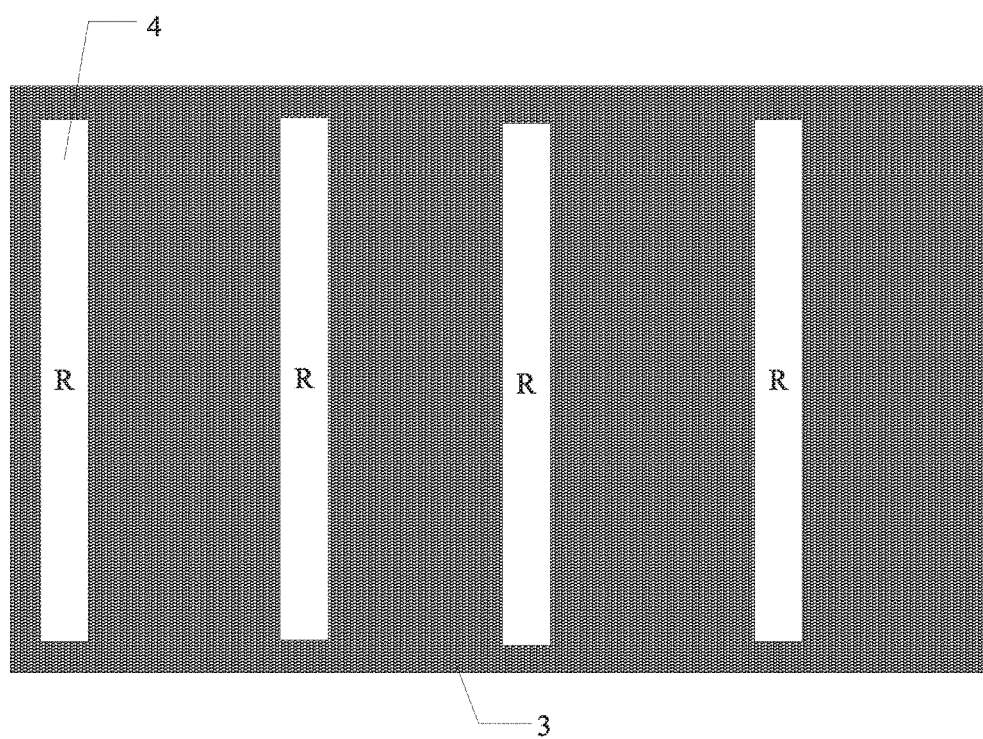
FIG. 2 is one mask used for fabricating the organic light emitting diode display device as shown in FIG. 1.

In an OLED display device, an arrangement mode of a pixel array is generally a side-by-side mode, and as shown in FIG. 1, the OLED display device comprises a base substrate 1, and pixel units 2 arranged in a matrix on the base substrate 1, one pixel unit 2 including three sub-pixels, i.e., red (R), green (G) and blue (B) sub-pixels parallel to each other. In order to form the pixel arrangement structure, a corresponding mask is shown in FIG. 2, in which FIG. 2 schematically shows a mask for forming one sub-pixel (R sub-pixel) in the pixel arrangement structure shown in FIG. 1. Since patterns of the sub-pixels are same, a mask of a same structure may be used for forming the remaining (G and B) sub-pixels.

In FIG. 2, the mask includes a metal substrate 3 and a rectangular opening 4 thereon; and since a same column of sub-pixels in the display device share a same opening, a length of the opening 4 of the mask is larger. For a low-resolution display device, since the number of pixels is smaller, a width of a metal strip between adjacent openings 4 in the mask is larger, so that fabrication and use management of the mask is easier. However, with increasing resolution of the display device, the width of the metal strip between adjacent openings in the mask becomes smaller, which results in that, during using the mask, the metal strip between the adjacent openings is susceptible to outside influence and easy to deformation, so as to cause cross-contamination of organic light emitting materials of different colors between the sub-pixels and then occurrence of color mixing, resulting in a low product yield.

Figure 3:
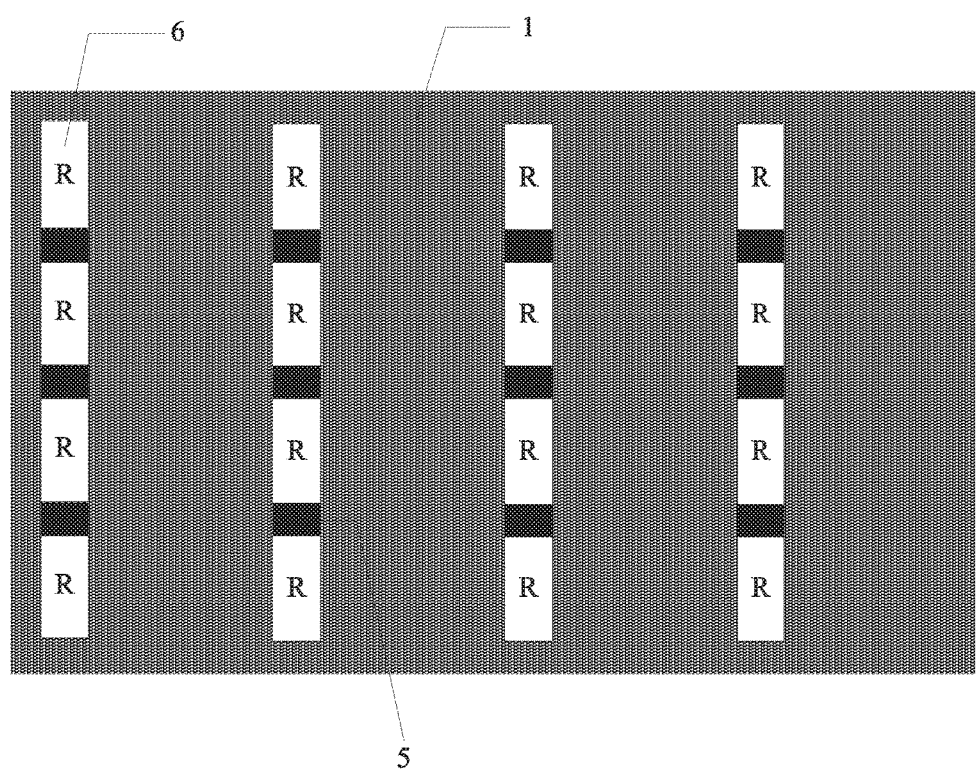
FIG. 3 is another mask used for fabricating the organic light emitting diode display device as shown in FIG. 1.

For the above-described problem, a mask as shown in FIG. 3 is proposed to form the pixel arrangement structure shown in FIG. 1. As shown in FIG. 3, in the mask, a metal bridge 5 is added in a position between the sub-pixels shown in FIG. 1 corresponding to the opening in the mask shown in FIG. 2, to connect adjacent metal strips, and a long-strip opening 4 as shown in FIG. 2 is changed into a plurality of openings 6 corresponding to the sub-pixels shown in FIG. 1. Although the method can make a shape of a long metal strip in the mask more stable, yet during fabricating the sub-pixel, in order to avoid a shielding effect generated by the metal bridge for the sub-pixel during evaporation, a sufficient distance must be maintained between the sub-pixel and the metal bridge, so that a size of the sub-pixel is reduced, so as to influence an aperture ratio of the OLED display device.

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments of the present disclosure, those ordinarily skilled in the art can obtain other embodiment(s), without any inventive work, which should be within the protective scope of the present disclosure.

Unless otherwise specified, the technical terms or scientific terms here should be of general meaning as understood by those ordinarily skilled in the art. In the specification and claims of the present disclosure of the patent application, words such as "first", "second" and the like do not denote any order, quantity, or importance, but rather are used for distinguishing different components. Similarly, words such as "one", "a/an" or "the" or the like do not denote quantitative limitation, but rather indicate there is at least one. Words such as "include" or "comprise" and the like denote that elements or objects appearing before the words of "include" or "comprise" cover the elements or the objects enumerated after the words of "include" or "comprise" or equivalents thereof, not exclusive of other elements or objects. Words such as "connected" or "connecting" and the like are not limited to physical or mechanical connections, but may include electrical connection, either direct or indirect. Words such as "up", "down", "left", "right" and the like are only used for expressing relative positional relationship, when the absolute position is a described object is changed, the relative positional relationship may also be correspondingly changed.

Embodiments of the present disclosure provide an organic light emitting diode display device, a display apparatus comprising the organic light emitting diode display device, and a mask for fabricating a sub-pixel of an organic light emitting diode display device. The organic light emitting diode display device having a new pixel arrangement mode is provided, so that a mask is fabricated more easily and has a high mechanical stability, so as to improve resolution and production efficiency of the organic light emitting diode display device, and achieve an objective of reducing production cost.

Figure 4A:
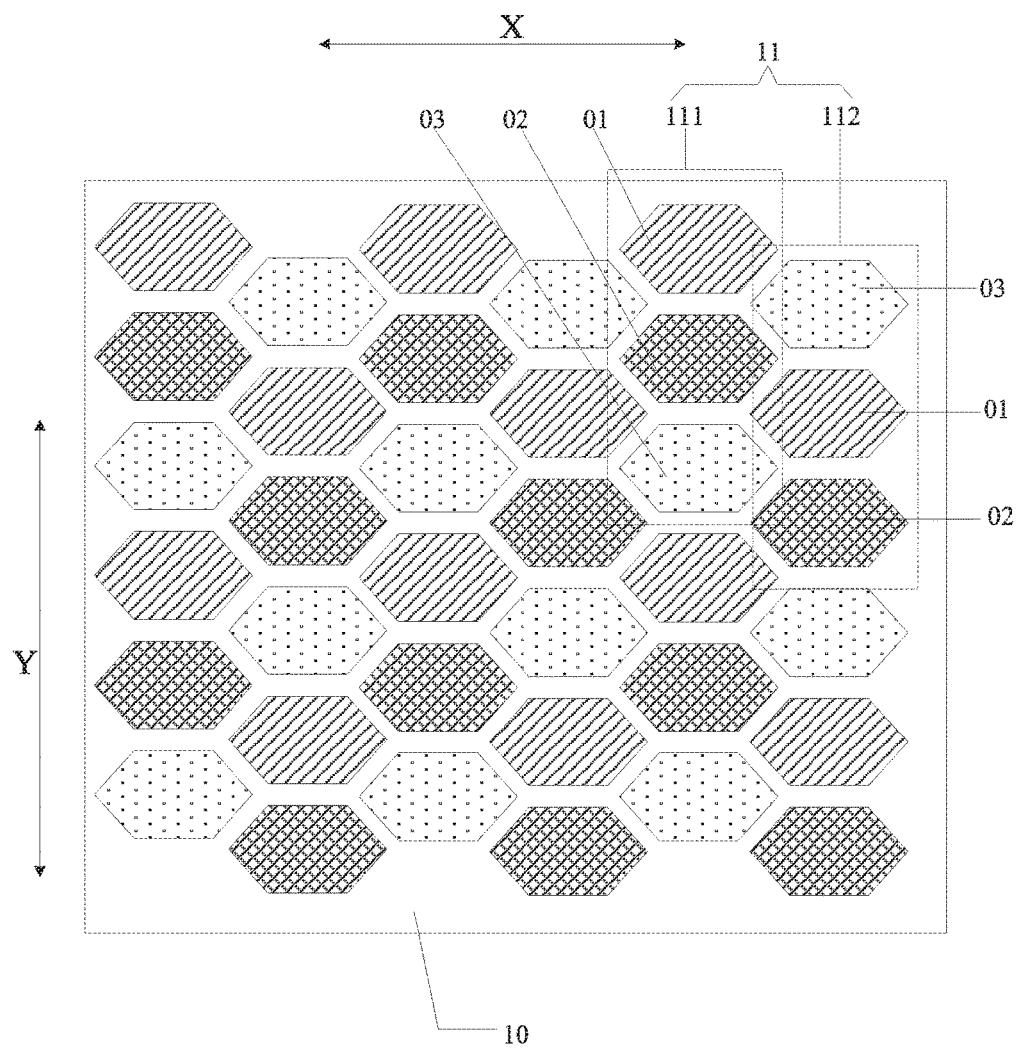
FIG. 4a is a structural schematic diagram I of an organic light emitting diode display device provided by an embodiment of the present disclosure.
Figure 4B:
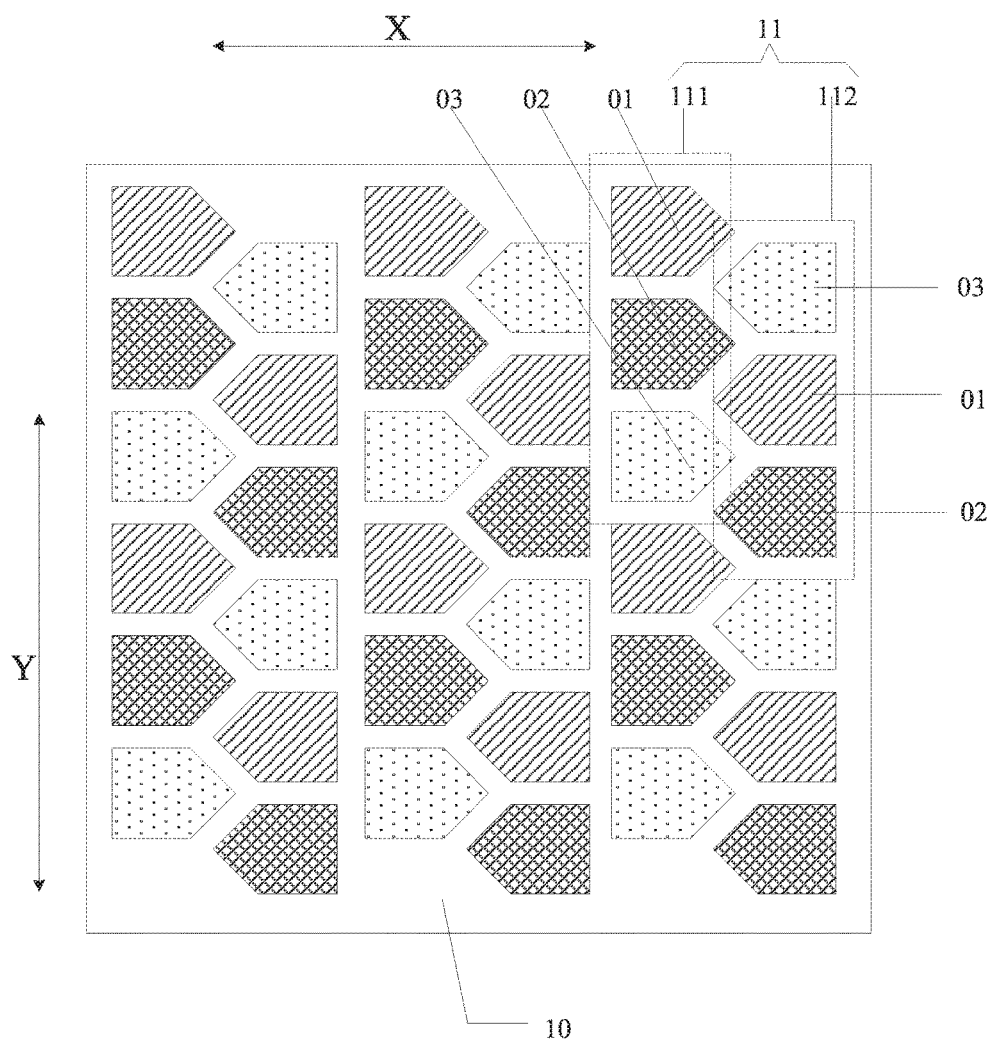
FIG. 4b is a structural schematic diagram II of the organic light emitting diode display device provided by the embodiment of the present disclosure.

An embodiment of the present disclosure provides an organic light emitting diode display device, as shown in FIG. 4a and FIG. 4b, comprising a base substrate 10 and a plurality of pixel unit groups 11 arranged in a matrix on the base substrate 10, and each pixel unit group 11 including a first sub-pixel unit group 111 and a second sub-pixel unit group 112 which are disposed adjacently along a first direction X and include three sub-pixels of different colors, respectively.

The first sub-pixel unit group 111 includes a first sub-pixel 01, a second sub-pixel 02 and a third sub-pixel 03 of different colors sequentially arranged along a second direction Y;

The second sub-pixel unit group 112 includes the third sub-pixel 03, the first sub-pixel 01 and the second sub-pixel 02 sequentially arranged along the second direction Y;

The three sub-pixels in the first sub-pixel unit group 111 and the three sub-pixels in the second sub-pixel unit group 112 are staggered along the second direction Y, and a color of any sub-pixel on the base substrate 10 is different from a color of any other sub-pixel adjacent to the sub-pixel;

And the sub-pixels in the pixel unit group 11 have a same shape, all present a shape of polygon with the number of sides greater than or equal to four.

Figure 12:
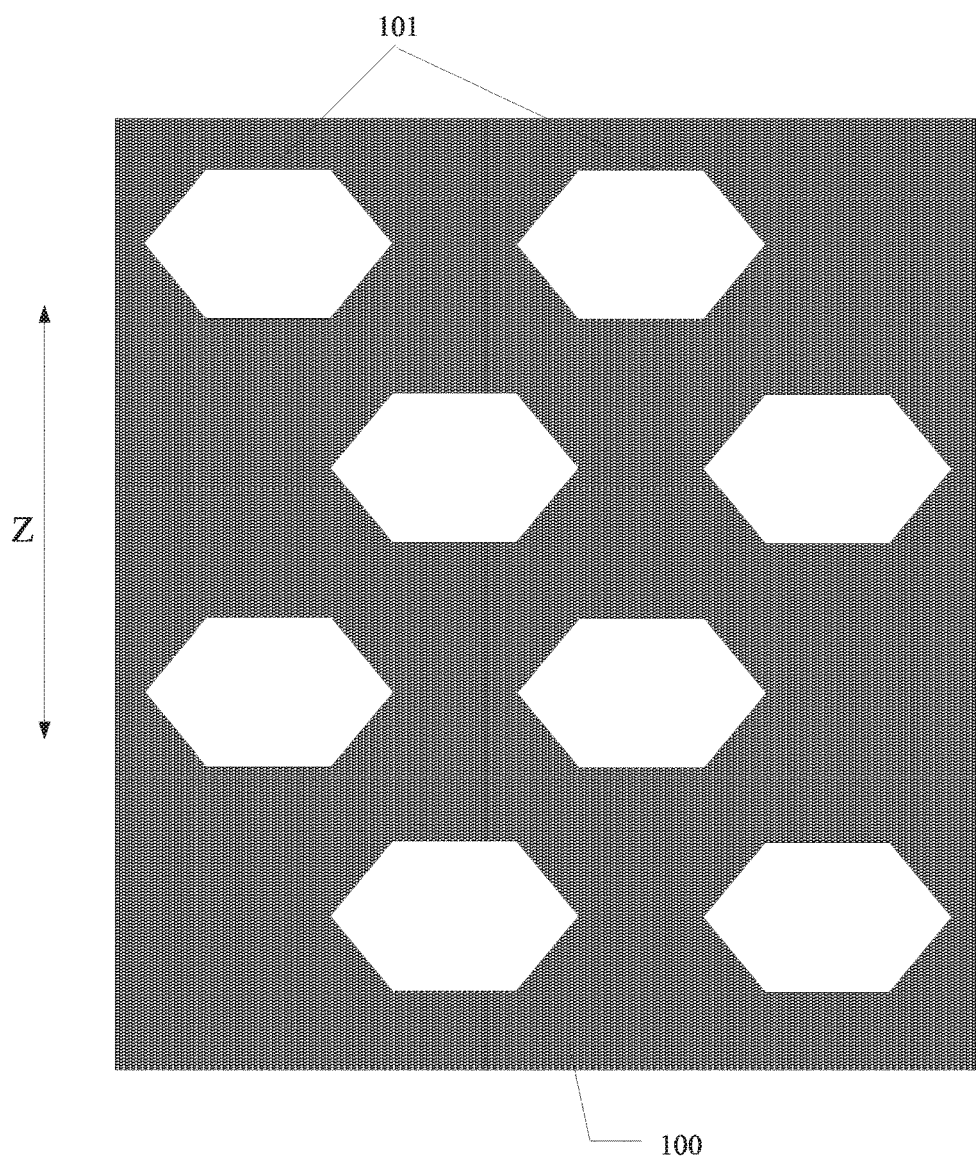
FIG. 12 is a structural schematic diagram of a mask provided by an embodiment of the present disclosure.

In the above-described organic light emitting diode display device provided by the embodiments of the present disclosure, each pixel unit group includes a first sub-pixel unit group and a second sub-pixel unit group which are arranged along a first direction and include three sub-pixels of different colors, respectively; the sub-pixels in the first sub-pixel unit group and the sub-pixels in the second sub-pixel unit group are staggered along a second direction, and a color of any sub-pixel on the base substrate is different from a color of any other sub-pixel adjacent to the sub-pixel; and thus, it is ensured that the sub-pixels of a same color are staggered regularly on the base substrate. Further, when a corresponding mask is fabricated, as shown in FIG. 12 (wherein FIG. 12 only shows a schematic diagram of an opening region in the mask corresponding to the sub-pixels of one color), a distance between adjacent opening regions 101 in the mask corresponding to the sub-pixels of the same color is relatively large, which increases strength of the mask, and is conducive to fabrication of the sub-pixel of a small size, so that the resolution of the organic light emitting diode display device can be improved.

In the above-described organic light emitting diode display device provided by the embodiments of the present disclosure, by using a mode that the first sub-pixel unit group and the second sub-pixel unit group in the same pixel unit group share a sub-pixel, for example, any two adjacent sub-pixels in the first sub-pixel unit group share a sub-pixel having a color different from that of the two sub-pixels in the second sub-pixel unit group, and any two adjacent sub-pixels in the second sub-pixel unit group share a sub-pixel having a color different from that of the two sub-pixels in the first sub-pixel unit group, so that a virtual display resolution of the screen can be improved. For example, when the original number of pixels is N, N being an integer greater than or equal to 2, after the above-described mode that the same pixel unit group shares the sub-pixel is used for the organic light emitting diode display device according to the present disclosure, the number of the pixels can be increased to 3N/2.

Figure 6:
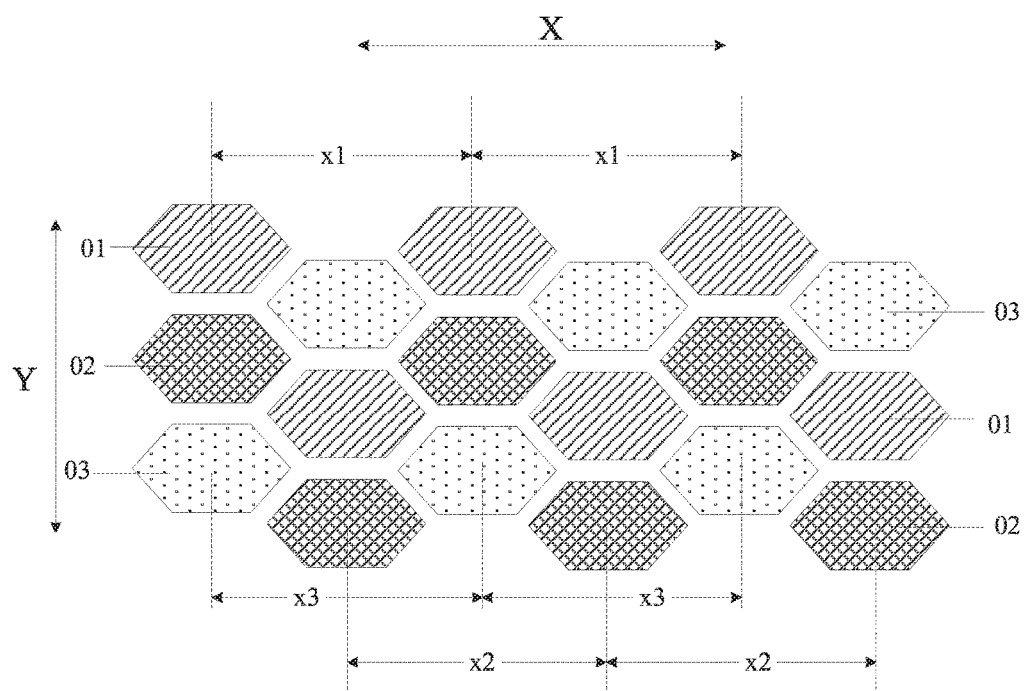
FIG. 6 is a structural schematic diagram III of an organic light emitting diode display device provided by an embodiment of the present disclosure.

For example, in the above-described organic light emitting diode display device provided by the embodiments of the present disclosure, as shown in FIG. 6, in the first direction X, a distance x1 between centers of two adjacent first sub-pixels 01, a distance x2 between centers of two adjacent second sub-pixels 02 and a distance x3 between centers of two adjacent third sub-pixels 03 are equal. Thereby, the sub-pixels on the array substrate are uniformly arranged, which not only can reduce difficulty in fabricating the organic light emitting diode display device, but also can reduce difficulty in fabricating the mask.

For example, in the above-described organic light emitting diode display device provided by the embodiments of the present disclosure, the first sub-pixel, the second sub-pixel and the third sub-pixel may correspond to a red (R) sub-pixel, a green (G) sub-pixel and a blue (B) sub-pixel. That is, in the embodiments of the present disclosure, the first sub-pixel is one of the red (R) sub-pixel, the green (G) and the blue (B) sub-pixel, the second sub-pixel is one of the red (R) sub-pixel, the green (G) and the blue (B) sub-pixel, and the third sub-pixel is one of the red (R) sub-pixel, the green (G) and the blue (B) sub-pixel, and colors of the first sub-pixel, the second sub-pixel and the third sub-pixel are all different.

For example, in the above-described organic light emitting diode display device provided by the embodiments of the present disclosure, the first direction is perpendicular to the second direction. All illustrations are provided in the embodiment of the present disclosure with a case where the first direction is perpendicular to the second direction as an example.

For example, the first direction is selected as one of a row direction and a column direction of the organic light emitting diode display device, and the second direction is selected as the other direction.

Figure 5:
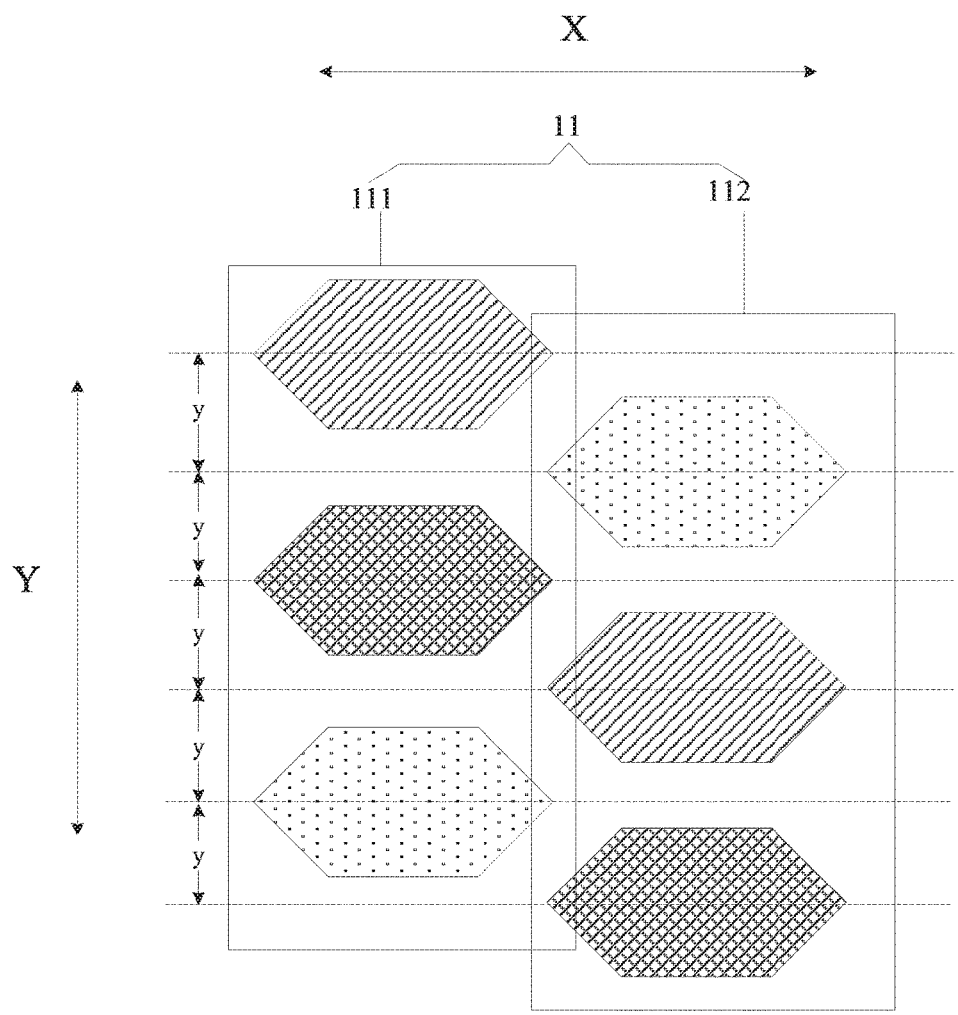
FIG. 5 is a structural schematic diagram I of one of pixel unit groups in an organic light emitting diode display device provided by an embodiment of the present disclosure.

For example, in the above-described organic light emitting diode display device provided by the embodiments of the present disclosure, as shown in FIG. 5, in a same pixel unit group 11, distances between a center of any sub-pixel in the first sub-pixel unit group 111 and centers of two sub-pixels adjacent to the sub-pixel in the second sub-pixel unit group 112 have equal components y in the second direction Y, and distances between a center of any sub-pixel in the second sub-pixel unit group 112 and centers of two sub-pixels adjacent to the sub-pixel in the first sub-pixel unit group 111 have equal components y in the second direction Y.

For example, in order to reduce the difficulty in fabricating a mask, and increase a light emitting area of the sub-pixel, in the above-described organic light emitting diode display device provided by the embodiment of the present disclosure, as shown in FIG. 4a, the sub-pixels all have a shape of parallel hexagon, and adjacent sides of adjacent sub-pixels are parallel; or, as shown in FIG. 4b, the sub-pixels all have a shape of pentagon, and adjacent sides of adjacent sub-pixels are parallel.

For example, in the above-described organic light emitting diode display device provided by the embodiments of the present disclosure, when the sub-pixels all have a shape of parallel hexagon, as shown in FIG. 4a, there are two parallel sides of the parallel hexagon extending along the first direction, and the remaining four sides have an equal length. Thus, adjacent sides between the opening regions of the mask corresponding to the adjacent sub-pixels coincide. Thereby, the light emitting area of the sub-pixel on the base substrate can be increased to a maximum extent, and by setting the sub-pixel to have a shape of parallel hexagon, a distance between the opening regions of the mask corresponding to the adjacent sub-pixels of a same color may be relatively large, which thus can further increase the strength of the mask, facilitate fabricating the sub-pixel of a small size, and can further improve the resolution of the organic light emitting diode display device.

For example, in the above-described organic light emitting diode display device provided by embodiments of the present disclosure, when the sub-pixels have a shape of pentagon, as shown in FIG. 4b, a better shape for the pentagon is to have two adjacent right angles, and two parallel sides constituting the two right angles are equal with each other. Thus, the two parallel sides in the pentagon extend along the first direction, so that adjacent sides between the opening regions of the mask corresponding to the adjacent sub-pixels can coincide. Thereby, the light emitting area of the sub-pixel on the base substrate can be increased to a maximum extent, and by setting the sub-pixel to have a shape of the above-described pentagon, a distance between the opening regions of the mask corresponding to the adjacent sub-pixel of a same color may be relatively large, which thus can further increase the strength of the mask, facilitate fabricating the sub-pixel of a small size, and can further improve the resolution of the organic light emitting diode display device.

Further, in order to reduce the number of the masks fabricated, in the above-described organic light emitting diode display device provided by the embodiment of the present disclosure, in a same pixel unit group, sizes and shapes of all of the sub-pixels are same. Thus, in the organic light emitting diode display device, arrangement positions of the sub-pixels of the same color present a same rule, and the sizes of the sub-pixels are also the same, that is, arrangement rules of the three types of sub-pixels of different colors are the same, and in this way, when the sub-pixels of different colors are being fabricated, a same mask can be used, so as to reduce the number of the masks fabricated.

For example, in order to prolong a service life of the organic light emitting diode display device, in the above-described organic light emitting diode display device provided by the embodiment of the present disclosure, in a same pixel unit group, a size of the red sub-pixel is equal to a size of the green sub-pixel, and a size of the blue sub-pixel is greater than a size of the red sub-pixel. This is because a service life of a blue light emitting material used for fabricating the blue sub-pixel is generally shortest, the service life of the organic light emitting diode display device primarily depends on the service life of the blue sub-pixel; under a condition that a same display luminance is achieved, when the size of the blue sub-pixel is increased, luminance of the blue sub-pixel can be reduced; and by reducing current density flowing through the blue sub-pixel, the service life of the blue sub-pixel can be extended, so as to further extend the service life of the organic light emitting diode display device.

For example, in order that the sub-pixels in the organic light emitting diode display device emit light, a pixel circuit for driving them to emit light is also needed; the pixel circuit is generally located below a light emitting layer, and the pixel circuit is electrically connected with an anode of the corresponding sub-pixel through a contact hole in a planarization layer located above the pixel circuit.

Figure 7:
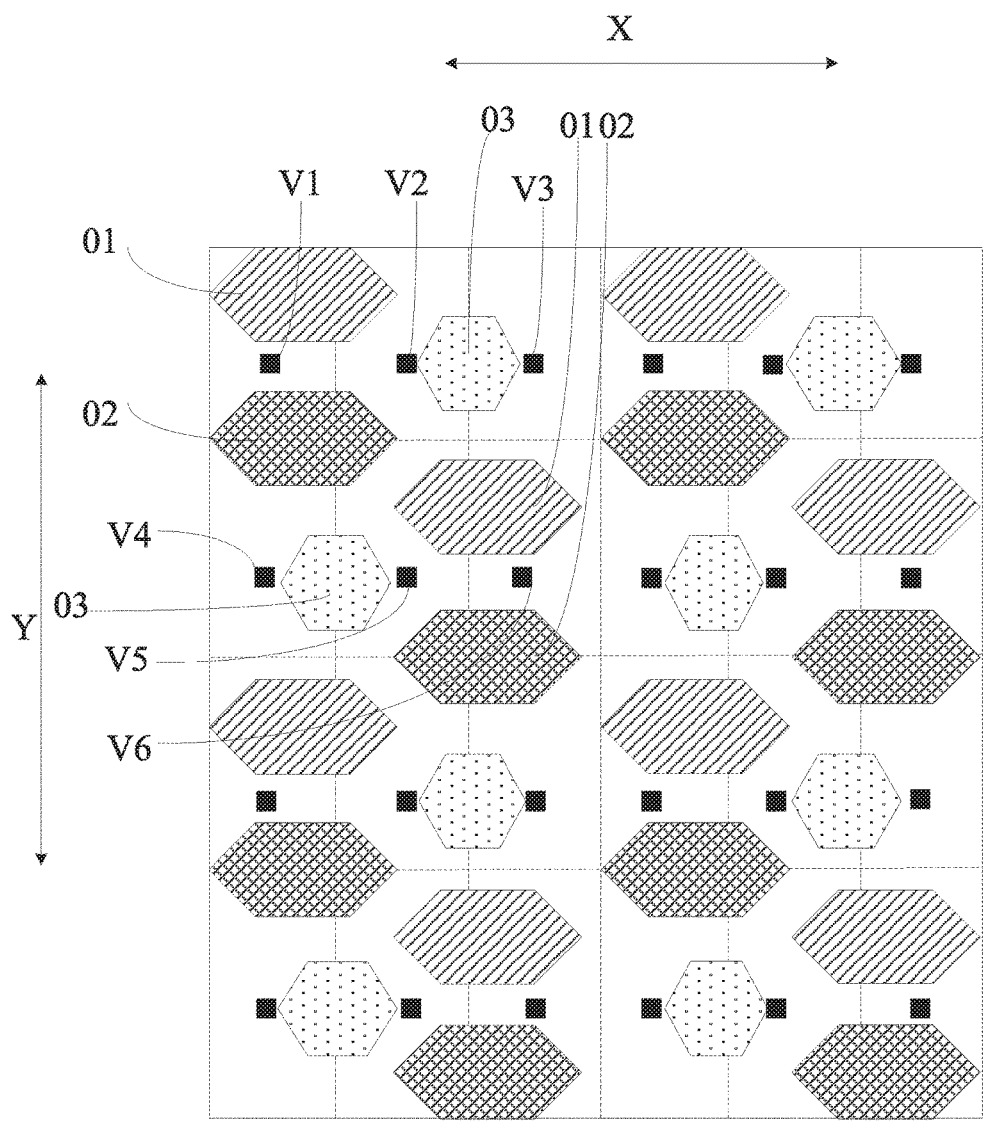
FIG. 7 is a structural schematic diagram IV of an organic light emitting diode display device provided by an embodiment of the present disclosure.

Thus, in the above-described organic light emitting diode display device provided by the embodiment of the present disclosure, as shown in FIG. 7, each pixel unit group 11 further includes the contact hole and the pixel circuit corresponding to the sub-pixels in a one-to-one correspondence relationship, each of the sub-pixels being electrically connected with the corresponding pixel circuit through the corresponding contact hole; wherein, A first contact hole V1 corresponding to the first sub-pixel 01 in the first sub-pixel unit group 111, a second contact hole V2 corresponding to the second sub-pixel 02 in the first sub-pixel unit group 111, and a third contact hole V3 corresponding to the third sub-pixel 03 in the second sub-pixel unit group 112 are aligned in the first direction X;

A fourth contact hole V4 corresponding to the third sub-pixel 03 in the first sub-pixel unit group 111, a fifth contact hole V5 corresponding to the first sub-pixel 01 in the second sub-pixel unit group 112, and a sixth contact hole V6 corresponding to the second sub-pixel 02 in the second sub-pixel unit group 112 are aligned in the first direction X;

And the first contact hole V1 and the fourth contact hole V4 are aligned in the second direction Y, the second contact hole V2 and the fifth contact hole V5 are aligned in the second direction Y, and the third contact hole V3 and the sixth contact hole V6 are aligned in the second direction Y.

For example, in the above-described organic light emitting diode display device provided by the embodiment of the present disclosure, two adjacent contact holes extending along the first direction have an equal distance; and two adjacent contact holes extending along the second direction have an equal distance. Thus, the contact holes on the base substrate are arrange in a matrix, so as to reduce difficulty in fabricating the contact hole, and to reduce difficulty in wiring in a back plate of the organic light emitting diode display device.

In order to further reduce the difficulty in fabrication, in the above-described organic light emitting diode display device provided by the embodiment of the present disclosure, sizes of the contact holes are consistent.

Figure 8:
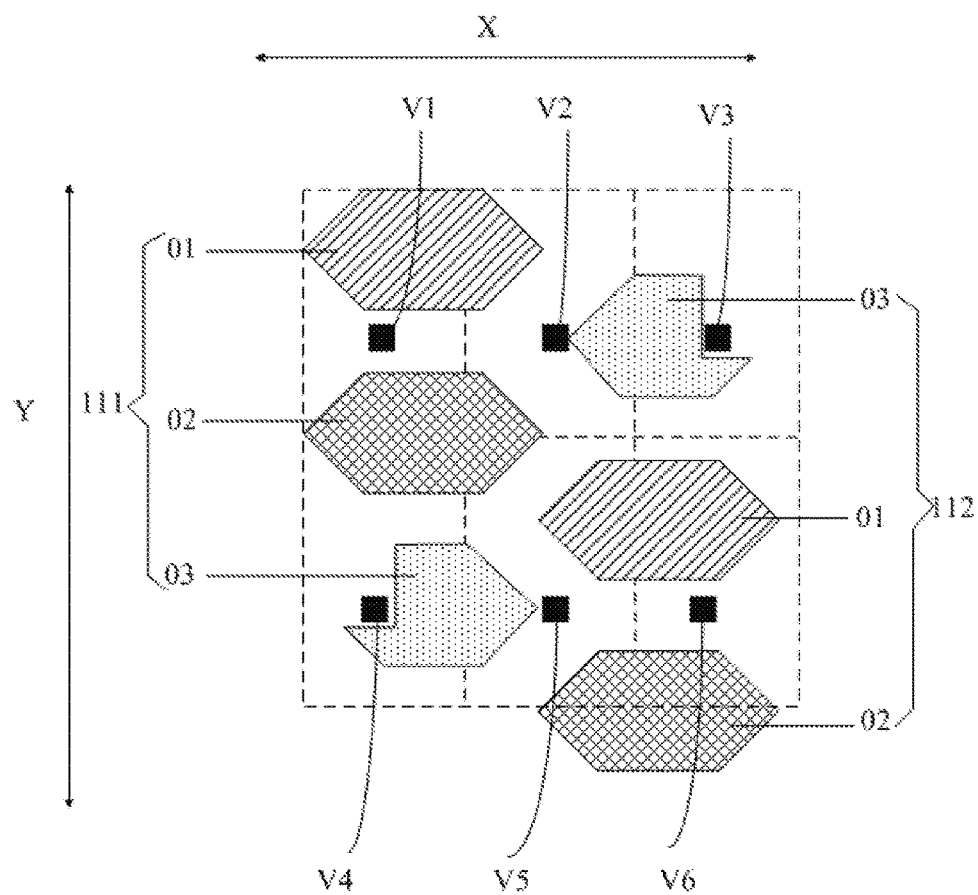
FIG. 8 is a specific structural schematic diagram II of one of pixel unit groups in an organic light emitting diode display device provided by an embodiment of the present disclosure.
Figure 9:
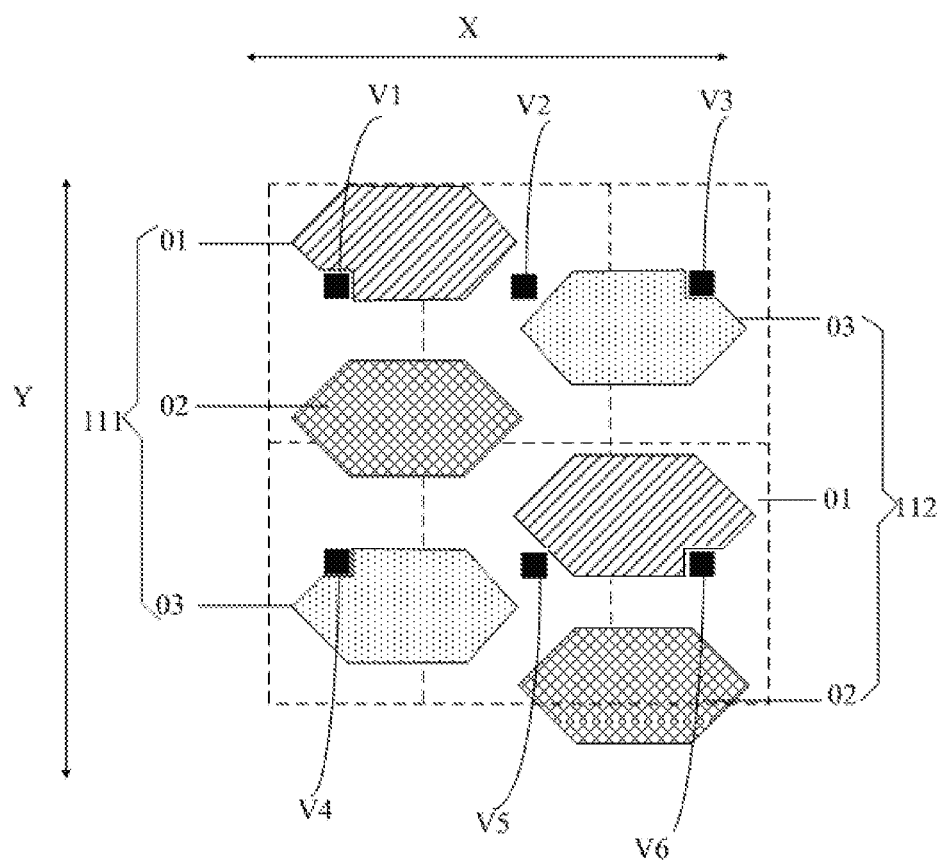
FIG. 9 is a specific structural schematic diagram III of one of pixel unit groups in an organic light emitting diode display device provided by an embodiment of the present disclosure.

Upon actual implementation, in the above-described organic light emitting diode display device provided by the embodiment of the present disclosure, in each pixel unit group, as shown in FIG. 7 to FIG. 9, The first contact hole V1 is located between the first sub-pixel 01 and the second sub-pixel 02 in the first sub-pixel unit group 111, and the second contact hole V2 and the third contact hole V3 are respectively located on both sides of the third sub-pixel 03 in the first direction X in the second sub-pixel unit group 112;

The fourth contact hole V4 and the fifth contact hole V5 are respectively located on both sides of the third sub-pixel 03 in the first direction X in the first sub-pixel unit group 111; and the sixth contact hole V6 is located between the first sub-pixel 01 and the second sub-pixel 02 in the second sub-pixel unit group 112.

In order to increase the light emitting area of the organic light emitting diode display device, in the above-described organic light emitting diode display device provided by the embodiment of the present disclosure, as shown in FIG. 8, in each pixel unit group 11, The first sub-pixel 01 and the second sub-pixel 02 have a shape of parallel hexagon, and the first sub-pixel 01 and the second sub-pixel 02 have their adjacent sides parallel; the third sub-pixel 03 in the first sub-pixel unit group 111 has a "boat" shape formed after the parallel hexagon misses a corner, wherein the corner missed in the parallel hexagon constituting the third sub-pixel 03 is adjacent to the second sub-pixel 02 in the first sub-pixel unit group 111; and a shape of the third sub-pixel 03 in the second sub-pixel unit group 112 after rotating 180 degrees along the first direction X is same as the shape of the third sub-pixel 03 in the first sub-pixel unit group 111;

The third contact hole V3 is located on the corner side missed in the parallel hexagon constituting the third sub-pixel 03 in the second sub-pixel unit group 112; the second contact hole V2 is located between the first contact hole V1 and the third contact hole V3; the fourth contact hole V4 is located on the corner side missed in the parallel hexagon constituting the third sub-pixel 03 in the first sub-pixel unit group 111; and the fifth contact hole V5 is located between the fourth contact hole V4 and the sixth contact hole V6.

Alternatively, in order to increase the light emitting area of the organic light emitting diode display device, in the above-described organic light emitting diode display device provided by embodiments of the present disclosure, as shown in FIG. 9, in each pixel unit group, The second sub-pixel 02 has a shape of parallel hexagon; the first sub-pixel 01 in the first sub-pixel unit group 111 has a "boat" shape formed after the parallel hexagon misses a corner, wherein the corner missed in the parallel hexagon constituting the first sub-pixel 01 is proximate to the second sub-pixel 02 in the first sub-pixel unit group 111; a shape of the first sub-pixel 01 in the first sub-pixel unit group 111 after rotating 180 degrees along the second direction Y is same as the shape of the third sub-pixel 03 in the first sub-pixel unit group 111; a shape of the first sub-pixel 01 in the second sub-pixel unit group 112 after rotating 180 degrees along the first direction X is same as the shape of the first sub-pixel 01 in the first sub-pixel unit group 111; and a shape of the third sub-pixel 03 in the second sub-pixel unit group 112 after rotating 180 degrees along the first direction X is same as the shape of the third sub-pixel 03 in the first sub-pixel unit group 111;

The first contact hole V1 is located on the corner side missed in the parallel hexagon constituting the first sub-pixel 01 in the first sub-pixel unit group 111; the third contact hole V3 is located on the corner side missed in the parallel hexagon constituting the third sub-pixel 03 in the second sub-pixel unit group 112; the second contact hole V2 is located between the first contact hole V1 and the third contact hole V3; the sixth contact hole V6 is located on the corner side missed in the parallel hexagon constituting the first sub-pixel 01 in the second sub-pixel unit group 112; the fourth contact hole V4 is located on the corner side missed in the parallel hexagon constituting the third sub-pixel 03 in the first sub-pixel unit group 111; and the fifth contact hole V5 is located between the fourth contact hole V4 and the sixth contact hole V6.

Figure 10:
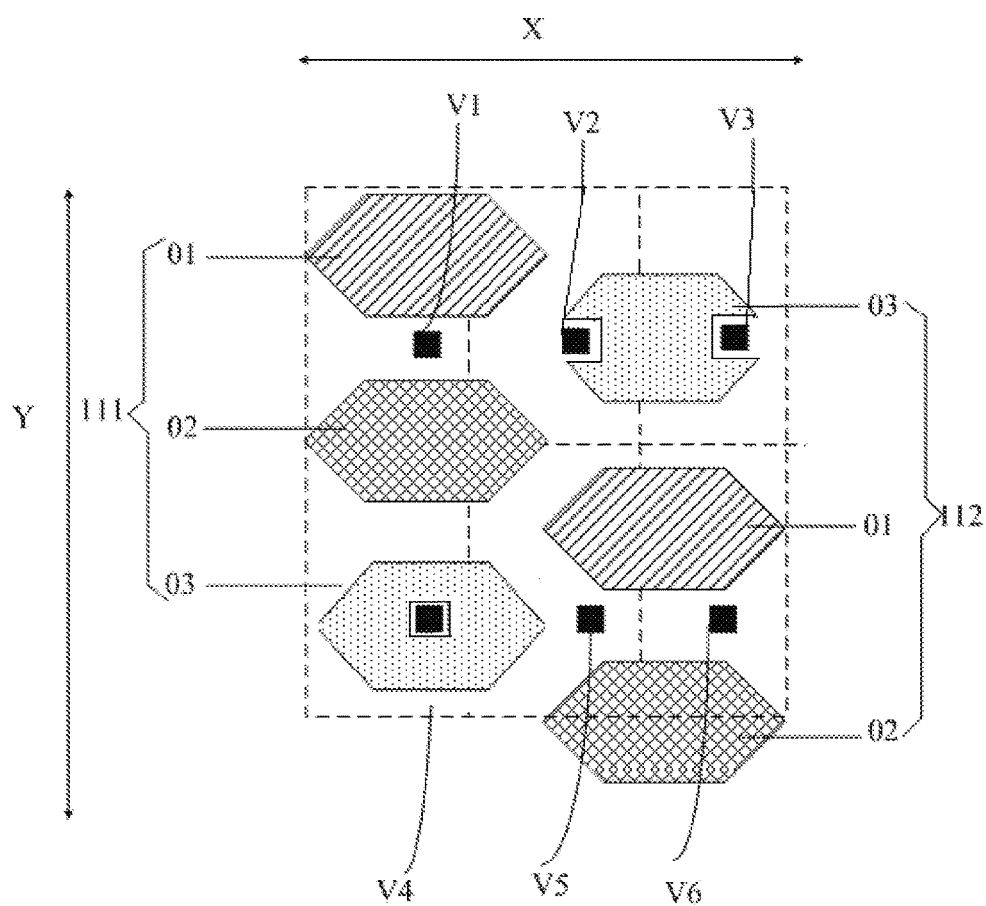
FIG. 10 is a specific structural schematic diagram IV of one of pixel unit groups in an organic light emitting diode display device provided by an embodiment of the present disclosure.

When being specifically implemented, the above-described organic light emitting diode display device provided by the embodiment of the present disclosure may further be as shown in FIG. 10, and in each pixel unit group, The first contact hole V1 is located between the first sub-pixel 01 and the second sub-pixel 02 in the first sub-pixel unit group 111, and the second contact hole V2 and the third contact hole V3 are respectively located on both sides of the third sub-pixel 03 in the first direction X in the second sub-pixel unit group 112; the fourth contact hole V4 is surrounded by the third sub-pixel 03 in the first sub-pixel unit group 111; and both the fifth contact hole V5 and the sixth contact hole V6 are located between the first sub-pixel 01 and the second sub-pixel 02 in the second sub-pixel unit group 112.

For example, upon actual implementation, in order to increase the light emitting area of the organic light emitting diode display device, in the above-described organic light emitting diode display device provided by the embodiment of the present disclosure, as shown in FIG. 10, in each pixel unit group, Both the first sub-pixel 01 and the second sub-pixel 02 have a shape of parallel hexagon; the third sub-pixel 03 in the first sub-pixel unit group 111 has a shape of hollow parallel hexagon, and the third sub-pixel 03 in the second sub-pixel unit group 112 have a shape of hourglass.

Figure 11:
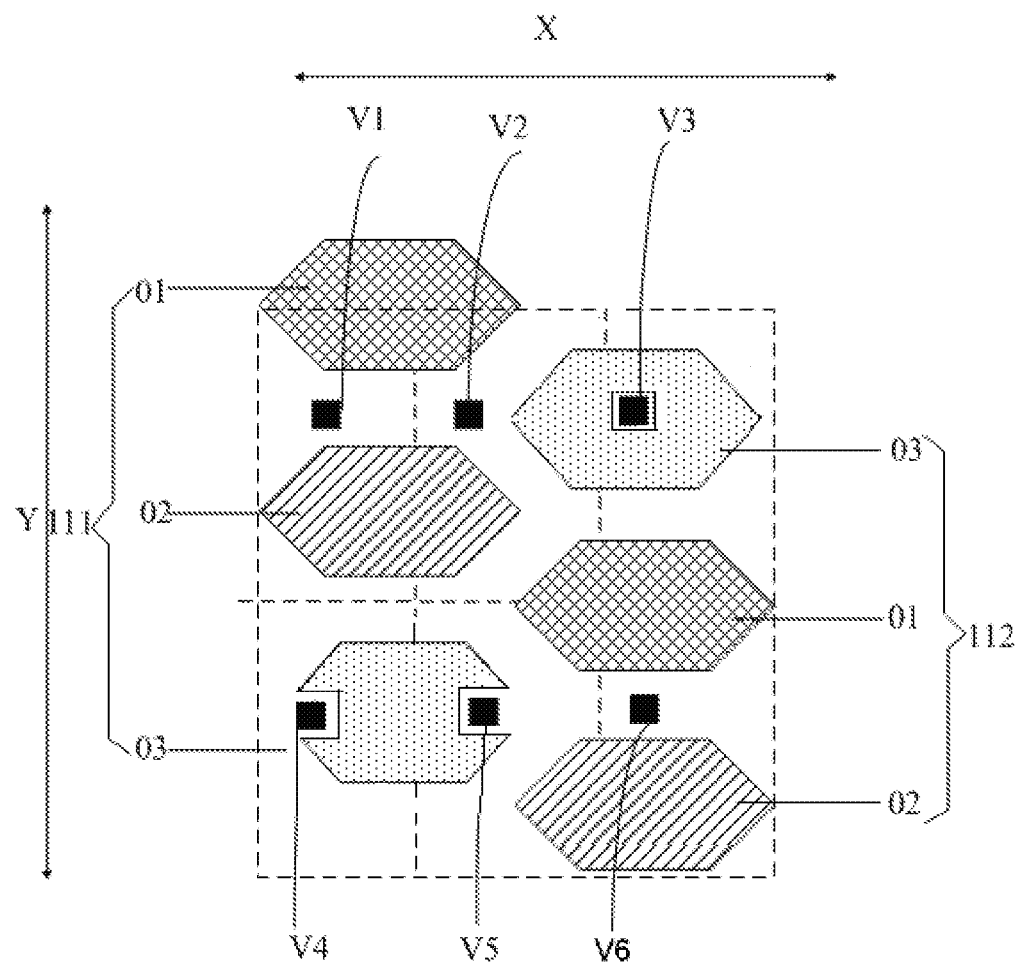
FIG. 11 is a specific structural schematic diagram V of one of pixel unit groups in an organic light emitting diode display device provided by an embodiment of the present disclosure.

Alternatively, when being specifically implemented, the above-described organic light emitting diode display device provided by the embodiment of the present disclosure may further be as shown in FIG. 11, and in each pixel unit group, Both the first contact hole V1 and the second contact hole V2 are located between the first sub-pixel 01 and the second sub-pixel 02 in the first sub-pixel unit group 111; the third contact hole V3 is surrounded by the third sub-pixel 03 in the second sub-pixel unit group 112; the fourth contact hole V4 and the fifth contact hole V5 are respectively located on both sides of the third sub-pixel 03 in the first direction X in the first sub-pixel unit group 111; and the sixth contact hole V6 is located between the first sub-pixel 01 and the second sub-pixel 02 in the second sub-pixel unit group 112.

For example, upon actual implementation, in order to increase the light emitting area of the organic light emitting diode display device, as shown in FIG. 11, in each pixel unit group, Both the first sub-pixel 01 and the second sub-pixel 02 have a shape of parallel hexagon; the third sub-pixel 03 in the first sub-pixel unit group 111 has a shape of hourglass, and the third sub-pixel 03 in the second sub-pixel unit group 112 have a shape of hollow parallel hexagon.

For example, in the above-described organic light emitting diode display device provided by the embodiment of the present disclosure, according to service life and display effect of the sub-pixels of different colors, the third sub-pixel is a green sub-pixel. Thereby, a size of the green sub-pixel is respectively less than sizes of the red sub-pixel and the blue sub-pixel.

For example, in the above-described organic light emitting diode display device provided by the embodiment of the present disclosure, in order to reduce the number of times for fabricating the mask, the size of the blue sub-pixel is equal to the size of the red sub-pixel.

Alternatively, for example, in the above-described organic light emitting diode display device provided by the embodiment of the present disclosure, in order to ensure the service life of the organic light emitting diode display device, the size of the blue sub-pixel is greater than the size of the red sub-pixel.

It should be noted that, in the above-described organic light emitting diode display device provided by the embodiment of the present disclosure, it is illustrated with a case where the sub-pixel is a parallel hexagon as an example, and a circle or an ellipse formed by rounding the hexagon also belongs to the protection scope of the embodiment of the present disclosure, which will not be limited here.

An embodiment of the present disclosure further provides a driving method of any of the above-described organic light emitting diode display devices, comprising: in a same pixel unit group, a first sub-pixel unit group and a second sub-pixel unit group sharing at least one sub-pixel. For example, a first sub-pixel and a second sub-pixel in the first sub-pixel unit group share a third sub-pixel in the second sub-pixel unit group, or a second sub-pixel and a third sub-pixel in the first sub-pixel unit group share a first sub-pixel in the second sub-pixel unit group, or a first sub-pixel and a second sub-pixel in the second sub-pixel unit group share a third sub-pixel in the first sub-pixel unit group, or a first sub-pixel and a third sub-pixel in the second sub-pixel unit group share a second sub-pixel in the first sub-pixel unit group. Therefore, after the above-described mode that the same pixel unit group shares sub-pixels is used, for example, when the number of original pixels is N (N being an integer greater than or equal to 2), the number of the pixels can be increased to 3N/2, so that the virtual display resolution of the screen can be improved.

The above-described driving method provided by the embodiment of the present disclosure, by using the mode that the same pixel unit group shares sub-pixels, can improve the virtual display resolution of the screen, and can increase the original number of the pixels by 3/2 times.

An embodiment of the present disclosure further provides a display apparatus, comprising the above-described organic light emitting diode display device provided by the embodiment of the present disclosure, and the display apparatus may be: a mobile phone, a tablet computer, a television, a monitor, a notebook computer, a digital photo frame, a navigator, or any other product or component having a display function. For all the other essential composite parts of the display apparatus, those ordinarily skilled in the art should understand that there are the same, which will not be repeated here, and should not be a limitation to the present disclosure. The embodiment of the above-described organic light emitting diode display device may be referred to for implementation of the display apparatus, and repeated parts will not be illustrated here.

An embodiment of the present disclosure further provides a mask for fabricating a sub-pixel of an organic light emitting diode display device, as shown in FIG. 12, comprising: a substrate 100, and a plurality of opening regions 101 of a same size arranged in a plurality of columns sequentially along a preset direction Z on the substrate 100, wherein, the opening regions 101 all have a shape of parallel hexagon, and adjacent sides of the adjacent opening regions 101 are parallel;

A center of any opening region 101 in an odd-numbered column is located on a midnormal of a connection line between centers of two opening regions 101 in even-numbered columns adjacent to the opening region 101 in the odd-numbered column, and a center of any opening region 101 in an even-numbered column is located on a midnormal of a connection line between centers of two opening regions 101 in odd-numbered columns adjacent to the opening region 101 in the even-numbered column;

And a width between two adjacent opening regions in a same column is greater than or equal to 2 times a maximum opening width of the opening region along the preset direction Z.

In the above-described mask provided by the embodiment of the present disclosure, the opening regions are in a shape of parallel hexagon, and a distance between the adjacent opening regions is relatively large, which thus can further increase the strength of the mask, facilitate fabricating the sub-pixel of a small size, and can further facilitate preparing the organic light emitting diode display device of a high resolution.

For example, in the above-described mask provided by the embodiment of the present disclosure, a width between the two adjacent opening regions along the preset direction is generally decided by an arrangement mode of the sub-pixels of the organic light emitting diode display device to be prepared; it is assumed that two sub-pixels of other colors are disposed between two adjacent sub-pixels of the same color in the organic light emitting diode display device, then, the width between the two adjacent opening regions along the preset direction in the mask should ensure a width sufficient to dispose two opening regions; in addition, for the organic light emitting diode display device, there is a distance of a certain width between the adjacent sub-pixels, and thus, the width between the two adjacent opening regions along the preset direction in the mask should ensure that at least two other sub-pixels can be disposed.

Figure 13:
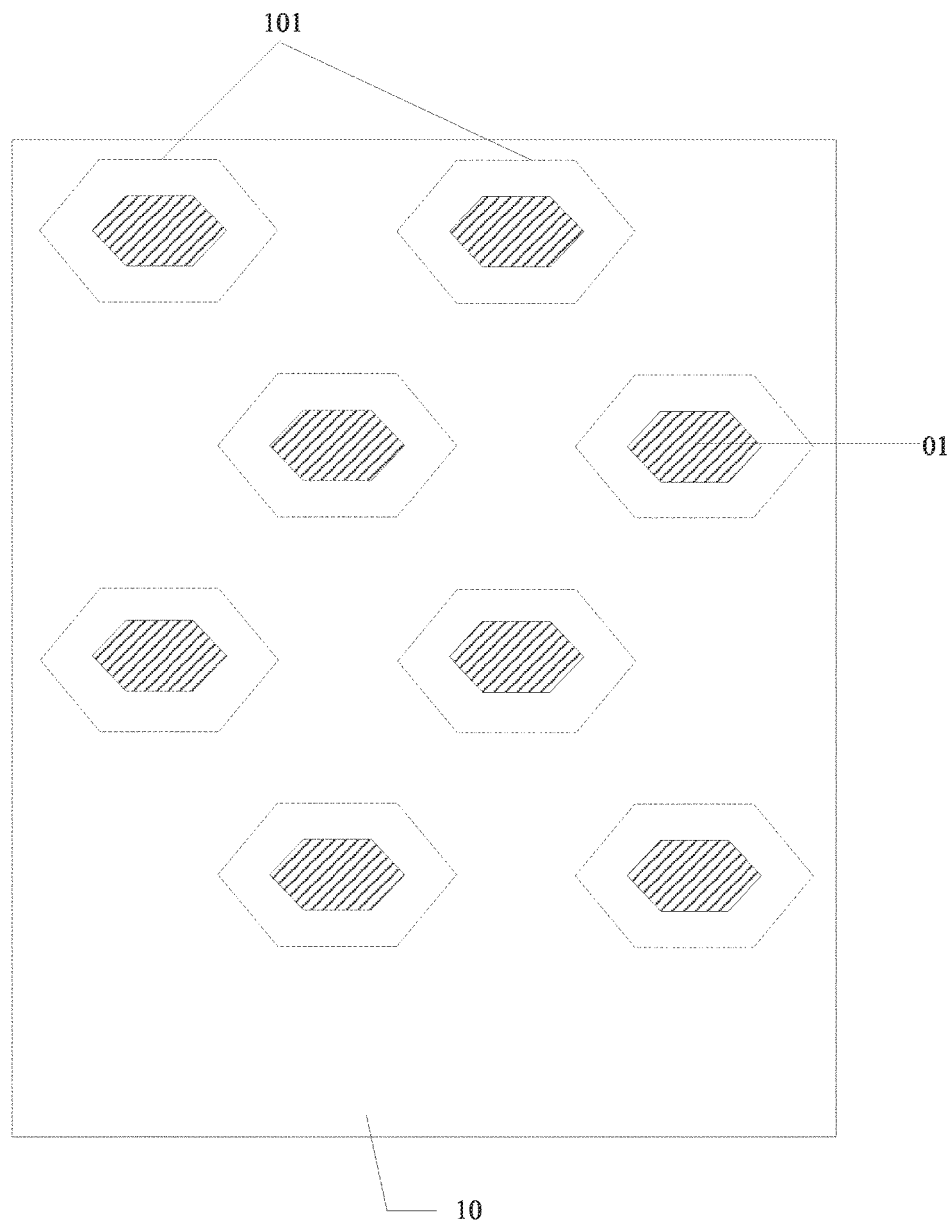
FIG. 13 to FIG. 15 are respectively structural schematic diagrams of an array substrate prepared sequentially by using the mask as shown in FIG. 12.
Figure 14:
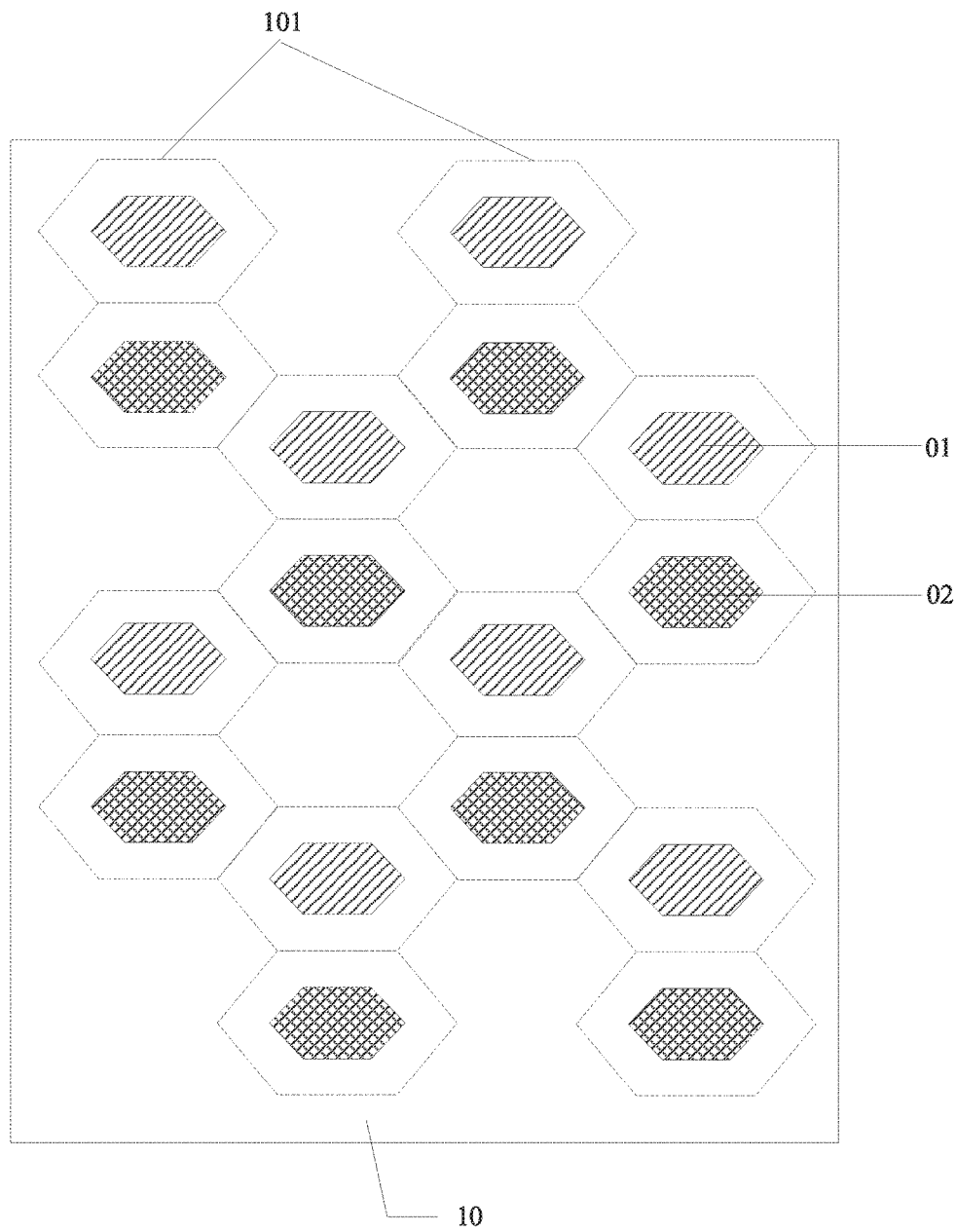
Figure 15:
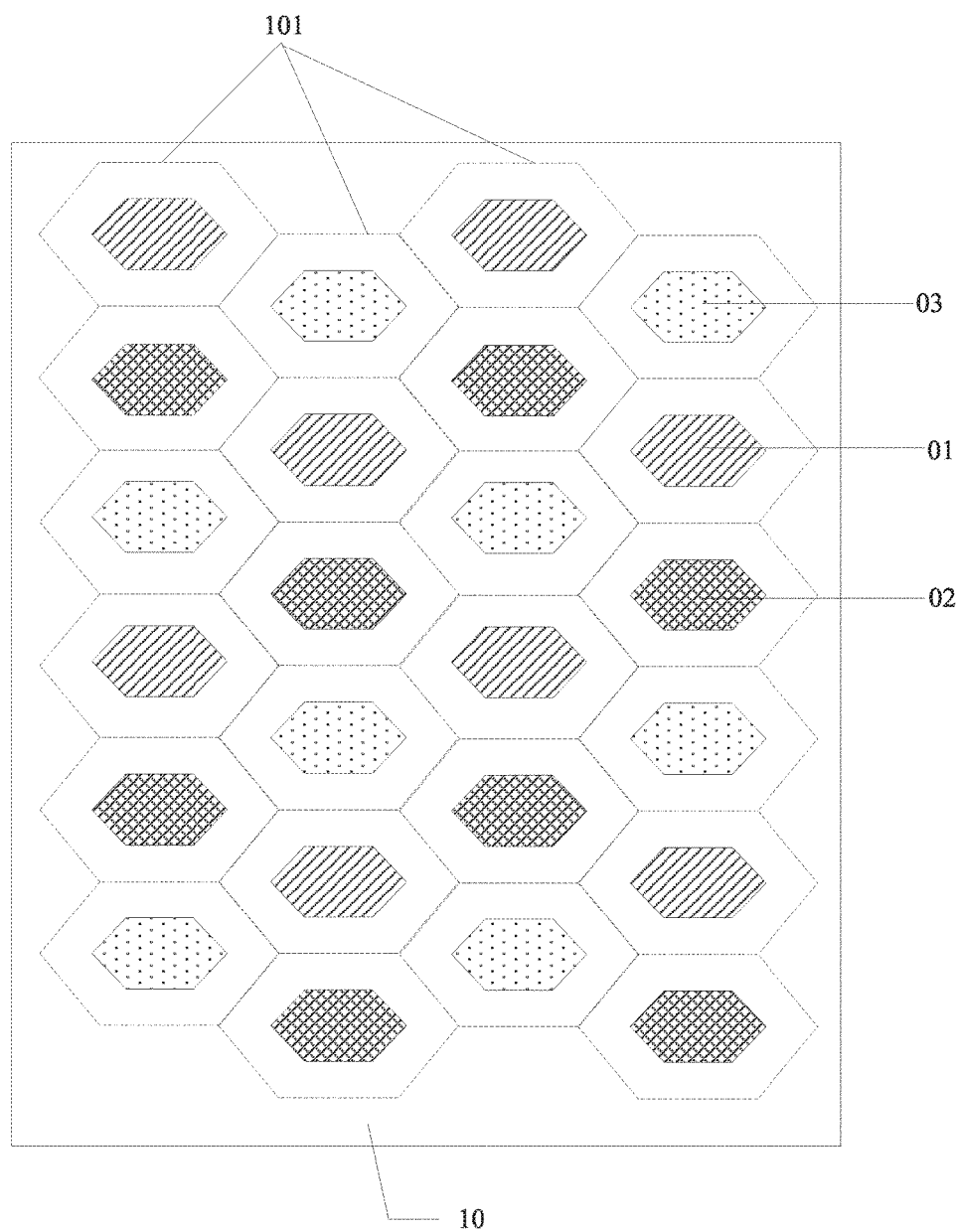

For example, when the above-described mask provided by the embodiment of the present disclosure is used for preparing the organic light emitting diode display device, when a sub-pixel array is formed, and when sub-pixels of other colors need to be formed after the sub-pixels of one color are formed, it is not necessary to fabricate a mask separately again for the sub-pixels of other colors, but it is only necessary to move the mask horizontally to a certain position, in order to form the sub-pixels of other colors, so that the number of the masks prepared can be reduced. The specific schematic diagrams are shown in FIG. 13 to FIG. 15, and the hexagonal dashed boxes in the diagrams represent the opening region 101 of a corresponding mask, wherein, FIG. 13 is an array substrate 10 after the first sub-pixel 01 is formed by using the mask shown in FIG. 12; FIG. 14 is an array substrate 10 after the second sub-pixel 02 is formed on the basis of the array substrate 10 of FIG. 13, after the above-described mask is moved; and FIG. 15 is an array substrate 10 after the third sub-pixel 03 is formed on the basis of the array substrate 10 of FIG. 14, after the above-described mask is moved, that is, one of the above-described organic light emitting diode display devices according to the embodiments of the present disclosure.

In the above-described mask provided by embodiments of the present disclosure, a shielding effect will be caused by an edge of the opening region to the sub-pixel during evaporation, and thus, an area of the sub-pixel corresponding to the opening region of the mask is less than an area of the opening region.

For example, in the above-described mask provided by the embodiment of the present disclosure, a width between two adjacent opening regions in a same column is equal to 2 times the maximum opening width of the opening region along the preset direction. Thus, when the sub-pixel arrangement shown in FIG. 15 is formed on the array substrate 10 by using the above-described mask, the above-described masks used when each type of sub-pixel is being formed overlap with one another, and adjacent sides of the opening regions 101 in the mask corresponding to the adjacent sub-pixels coincide, so as to ensure an aperture ratio of the array substrate.

The embodiments of the present disclosure provide the organic light emitting diode display device, the display apparatus, and the mask for fabricating the sub-pixel of the organic light emitting diode display device; each pixel unit group includes the first sub-pixel unit group and the second sub-pixel unit group which are disposed adjacently along the first direction and include three sub-pixels of different colors, respectively; the sub-pixels in the first sub-pixel unit group and the sub-pixels in the second sub-pixel unit group are staggered along the second direction, and the color of any sub-pixel on the base substrate is different from the color of other sub-pixel adjacent to the sub-pixel; and thus, it is ensured that the sub-pixels of a same color are staggered regularly on the base substrate. Further, when the corresponding mask is fabricated, the distance between adjacent opening regions in the mask corresponding to the sub-pixels of the same color is relatively large, which increases the strength of the mask, and is conducive to fabrication of the sub-pixel of a small size, so that the resolution of the organic light emitting diode display device can be improved.

The foregoing embodiments merely are exemplary embodiments of the present disclosure, and not intended to define the scope of the present disclosure, and the scope of the disclosure is determined by the appended claims.

This application claims priority of Chinese Patent Application No. 201410714887.0 filed on Nov. 28, 2014, the disclosure of which is incorporated herein by reference in its entirety as part of the present application.

The invention claimed is:

1. An organic light emitting diode display device, comprising a base substrate and a plurality of pixel unit groups arranged in a matrix on the base substrate, and each of the pixel unit groups including a first sub-pixel unit group and a second sub-pixel unit group which are disposed adjacently along a first direction, and each of the first sub-pixel unit group and the second sub-pixel unit group comprising three sub-pixels of different colors, wherein the first sub-pixel unit group includes a first sub-pixel, a second sub-pixel and a third sub-pixel sequentially arranged along a second direction, and the second sub-pixel unit group includes a third sub-pixel, a first sub-pixel and a second sub-pixel sequentially arranged along the second direction;

the three sub-pixels in the first sub-pixel unit group and the three sub-pixels in the second sub-pixel unit group are staggered along the second direction, and a color of any sub-pixel on the base substrate is different from a color of any other sub-pixel adjacent to the sub-pixel; and each of the sub-pixels in the pixel unit group has a shape of polygon with the number of sides greater than or equal to four;

wherein each of the pixel unit groups further includes a contact hole and a pixel circuit corresponding to the sub-pixels in a one-to-one correspondence relationship, each of the sub-pixels being electrically connected with the corresponding pixel circuit through the corresponding contact hole; wherein a first contact hole corresponding to the first sub-pixel in the first sub-pixel unit group, a second contact hole corresponding to the second sub-pixel in the first sub-pixel unit group, and a third contact hole corresponding to the third sub-pixel in the second sub-pixel unit group are aligned in the first direction;

a fourth contact hole corresponding to the third sub-pixel in the first sub-pixel unit group, a fifth contact hole corresponding to the first sub-pixel in the second sub-pixel unit group, and a sixth contact hole corresponding to the second sub-pixel in the second sub-pixel unit group are aligned in the first direction;

and the first contact hole and the fourth contact hole are aligned in the second direction, the second contact hole and the fifth contact hole are aligned in the second direction, and the third contact hole and the sixth contact hole are aligned in the second direction.

2. The organic light emitting diode display device according to claim 1, wherein, in the first direction, a distance between centers of two adjacent first sub-pixels, a distance between centers of two adjacent second sub-pixels and a distance between centers of two adjacent third sub-pixels are equal.

3. The organic light emitting diode display device according to claim 2, wherein the first sub-pixel, the second sub-pixel and the third sub-pixel correspond to a red sub-pixel, a green sub-pixel and a blue sub-pixel.

4. The organic light emitting diode display device according to claim 3, wherein, in a same pixel unit group, distances between a center of any sub-pixel in the first sub-pixel unit group and centers of two sub-pixels adjacent to the sub-pixel in the second sub-pixel unit group have equal components in the second direction, and distances between a center of any sub-pixel in the second sub-pixel unit group and centers of two sub-pixels adjacent to the sub-pixel in the first sub-pixel unit group have equal components in the second direction.

5. The organic light emitting diode display device according to claim 4, wherein each of the sub-pixels has a shape of parallel hexagon or pentagon, and adjacent sides of adjacent sub-pixels are parallel.

6. The organic light emitting diode display device according to claim 1, wherein any two adjacent contact holes have an equal distance to that of any other two adjacent contact holes extending along the first direction, and any two adjacent contact holes have an equal distance to that of any other two adjacent contact holes extending along the second direction.

7. The organic light emitting diode display device according to claim 6, wherein, in each of the pixel unit groups:

the first contact hole is located between the first sub-pixel and the second sub-pixel in the first sub-pixel unit group, and the second contact hole and the third contact hole are respectively located on two sides of the third sub-pixel in the first direction in the second sub-pixel unit group;

the fourth contact hole and the fifth contact hole are respectively located on two sides of the third sub-pixel in the first direction in the first sub-pixel unit group; and the sixth contact hole is located between the first sub-pixel and the second sub-pixel in the second sub-pixel unit group.

8. The organic light emitting diode display device according to claim 6, wherein, in each of the pixel unit groups:

the first sub-pixel and the second sub-pixel have a shape of parallel hexagon, and adjacent sides of the first sub-pixel and the second sub-pixel are parallel; the third sub-pixel in the first sub-pixel unit group has a "boat" shape formed after the parallel hexagon misses a corner, wherein the corner missed in the parallel hexagon constituting the third sub-pixel is proximate to the second sub-pixel in the first sub-pixel unit group; and a shape of the third sub-pixel in the second sub-pixel unit group after rotating 180 degrees along the first direction is same as the shape of the third sub-pixel in the first sub-pixel unit group;

the third contact hole is located on the corner side missed in the parallel hexagon constituting the third sub-pixel in the second sub-pixel unit group; the second contact hole is located between the first contact hole and the third contact hole; the fourth contact hole is located on the corner side missed in the parallel hexagon constituting the third sub-pixel in the first sub-pixel unit group; and the fifth contact hole is located between the fourth contact hole and the sixth contact hole.

9. The organic light emitting diode display device according to claim 6, wherein, in each of the pixel unit groups:

the second sub-pixel has a shape of parallel hexagon; the first sub-pixel in the first sub-pixel unit group has a "boat" shape formed after the parallel hexagon misses a corner, wherein the corner missed in the parallel hexagon constituting the first sub-pixel is proximate to the second sub-pixel in the first sub-pixel unit group; a shape of the first sub-pixel in the first sub-pixel unit group after rotating 180 degrees along the second direction is same as the shape of the third sub-pixel in the first sub-pixel unit group; a shape of the first sub-pixel in the second sub-pixel unit group after rotating 180 degrees along the first direction is same as the shape of the first sub-pixel in the first sub-pixel unit group; and a shape of the third sub-pixel in the second sub-pixel unit group after rotating 180 degrees along the first direction is same as the shape of the third sub-pixel in the first sub-pixel unit group;

the first contact hole is located on the corner side missed in the parallel hexagon constituting the first sub-pixel in the first sub-pixel unit group; the third contact hole is located on the corner side missed in the parallel hexagon constituting the third sub-pixel in the second sub-pixel unit group; the second contact hole is located between the first contact hole and the third contact hole; the sixth contact hole is located on the corner side missed in the parallel hexagon constituting the first sub-pixel in the second sub-pixel unit group; the fourth contact hole is located on the corner side missed in the parallel hexagon constituting the third sub-pixel in the first sub-pixel unit group; and the fifth contact hole is located between the fourth contact hole and the sixth contact hole.

10. The organic light emitting diode display device according to claim 6, wherein, in each of the pixel unit groups:

the first contact hole is located between the first sub-pixel and the second sub-pixel in the first sub-pixel unit group, and the second contact hole and the third contact hole are respectively located on two sides of the third sub-pixel in the first direction in the second sub-pixel unit group; the fourth contact hole is surrounded by the third sub-pixel in the first sub-pixel unit group; and both the fifth contact hole and the sixth contact hole are located between the first sub-pixel and the second sub-pixel in the second sub-pixel unit group.

11. The organic light emitting diode display device according to claim 10, wherein, in each of the pixel unit groups:
both the first sub-pixel and the second sub-pixel have a shape of parallel hexagon; the third sub-pixel in the first sub-pixel unit group has a shape of hollow parallel hexagon, and the third sub-pixel in the second sub-pixel unit group has a shape of hourglass.

12. The organic light emitting diode display device according to claim 6, wherein, in each of the pixel unit groups:
both the first contact hole and the second contact hole are located between the first sub-pixel and the second sub-pixel in the first sub-pixel unit group; the third contact hole is surrounded by the third sub-pixel in the second sub-pixel unit group; the fourth contact hole and the fifth contact hole are respectively located on two sides of the third sub-pixel in the first direction in the first sub-pixel unit group; and the sixth contact hole is located between the first sub-pixel and the second sub-pixel in the second sub-pixel unit group.

13. The organic light emitting diode display device according to claim 12, wherein, in each of the pixel unit groups:
both the first sub-pixel and the second sub-pixel have a shape of parallel hexagon; the third sub-pixel in the first sub-pixel unit group has a shape of hourglass, and the third sub-pixel in the second sub-pixel unit group has a shape of hollow parallel hexagon.

14. The organic light emitting diode display device according to claim 1, wherein the third sub-pixel is a green sub-pixel.

15. A display apparatus, comprising an organic light emitting diode display device, wherein the organic light emitting diode display device comprises:
a base substrate and a plurality of pixel unit groups arranged in a matrix on the base substrate, and each of the pixel unit groups including a first sub-pixel unit group and a second sub-pixel unit group which are disposed adjacently along a first direction, and each of the first sub-pixel unit group and the second sub-pixel unit group comprising three sub-pixels of different colors, wherein
the first sub-pixel unit group includes a first sub-pixel, a second sub-pixel and a third sub-pixel sequentially arranged along a second direction, and the second sub-pixel unit group includes a third sub-pixel, a first sub-pixel and a second sub-pixel sequentially arranged along the second direction;
the three sub-pixels in the first sub-pixel unit group and the three sub-pixels in the second sub-pixel unit group are staggered along the second direction, and a color of any sub-pixel on the base substrate is different from a color of any other sub-pixel adjacent to the sub-pixel; and
each of the sub-pixels in the pixel unit group has a shape of polygon with the number of sides greater than or equal to four;
wherein each of the pixel unit groups further includes a contact hole and a pixel circuit corresponding to the sub-pixels in a one-to-one correspondence relationship, each of the sub-pixels being electrically connected with the corresponding pixel circuit through the corresponding contact hole; wherein
a first contact hole corresponding to the first sub-pixel in the first sub-pixel unit group, a second contact hole corresponding to the second sub-pixel in the first sub-pixel unit group, and a third contact hole corresponding to the third sub-pixel in the second sub-pixel unit group are aligned in the first direction;
a fourth contact hole corresponding to the third sub-pixel in the first sub-pixel unit group, a fifth contact hole corresponding to the first sub-pixel in the second sub-pixel unit group, and a sixth contact hole corresponding to the second sub-pixel in the second sub-pixel unit group are aligned in the first direction;
and the first contact hole and the fourth contact hole are aligned in the second direction, the second contact hole and the fifth contact hole are aligned in the second direction, and the third contact hole and the sixth contact hole are aligned in the second direction.

* * * * *